United States Patent [19]
Dao

[11] Patent Number: 5,537,063
[45] Date of Patent: Jul. 16, 1996

[54] CMOS LOGIC CIRCUIT WITH PLURAL INPUTS

[75] Inventor: Joseph Dao, Sagamihara, Japan

[73] Assignee: Kabushiki Kaisha Toshiba, Kawasaki, Japan

[21] Appl. No.: 359,454

[22] Filed: Dec. 20, 1994

[30] Foreign Application Priority Data

Dec. 24, 1993 [JP] Japan ..................... 5-327681

[51] Int. Cl.$^6$ ..................... H03K 19/096; H03K 19/094
[52] U.S. Cl. ................................ 326/98; 326/121
[58] Field of Search ............................... 326/121, 81, 83, 326/98

[56] References Cited

U.S. PATENT DOCUMENTS

| | | | |
|---|---|---|---|
| 3,925,685 | 12/1975 | Suzuki | 326/98 |
| 4,661,728 | 4/1987 | Kashimra | 326/98 |
| 4,734,597 | 3/1988 | Ullrich et al. | 326/98 |
| 4,804,868 | 2/1989 | Masuda et al. | 326/98 |
| 5,034,629 | 7/1991 | Kinugasa et al. | 326/121 |

OTHER PUBLICATIONS

Mark G. Johnson, "Special Correspondence: A Symmetric CMOS Nor Gate for High–Speed Applications", IEEE Journ. Solid–State Circuits, vol. 23, No. 5, 1988, pp. 1233–1236.

Primary Examiner—Edward P. Westin
Assistant Examiner—Richard Roseen
Attorney, Agent, or Firm—Foley & Lardner

[57] ABSTRACT

There is provided a CMOS logic circuit designed in a manner to have preference to either operation speed or power consumption. This CMOS logic circuit comprises a first circuit assembly including a plurality of N number of P-channel type MOS transistors, a second circuit assembly including N-number of N-channel type MOS transistors, and a switching element operative so that ON/OFF state is switched by a clock signal inputted from the external. The first and second circuit assemblies and the switching element are connected in series, e.g., between power supply voltage terminal and the ground terminal.

8 Claims, 11 Drawing Sheets

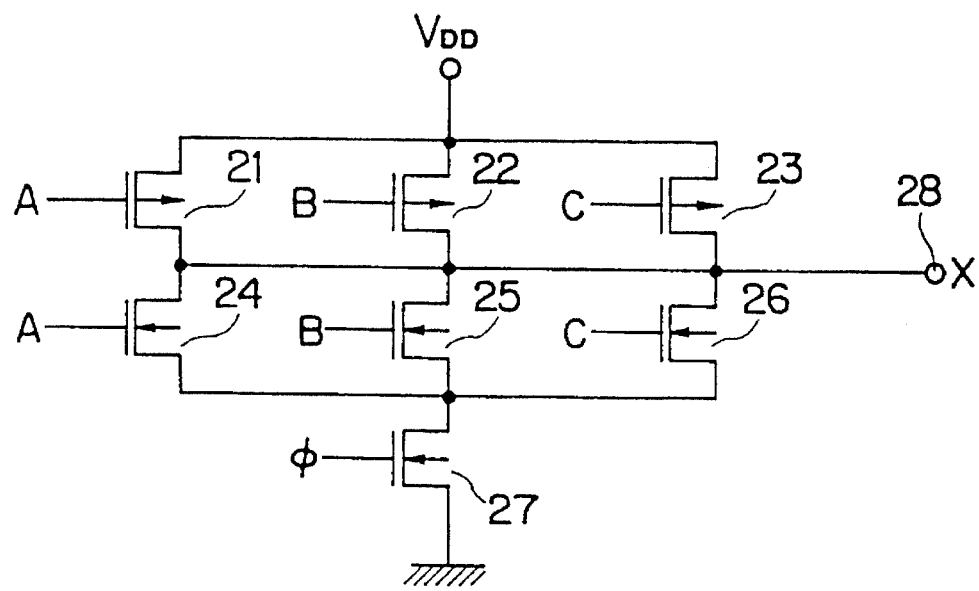
F I G. 6
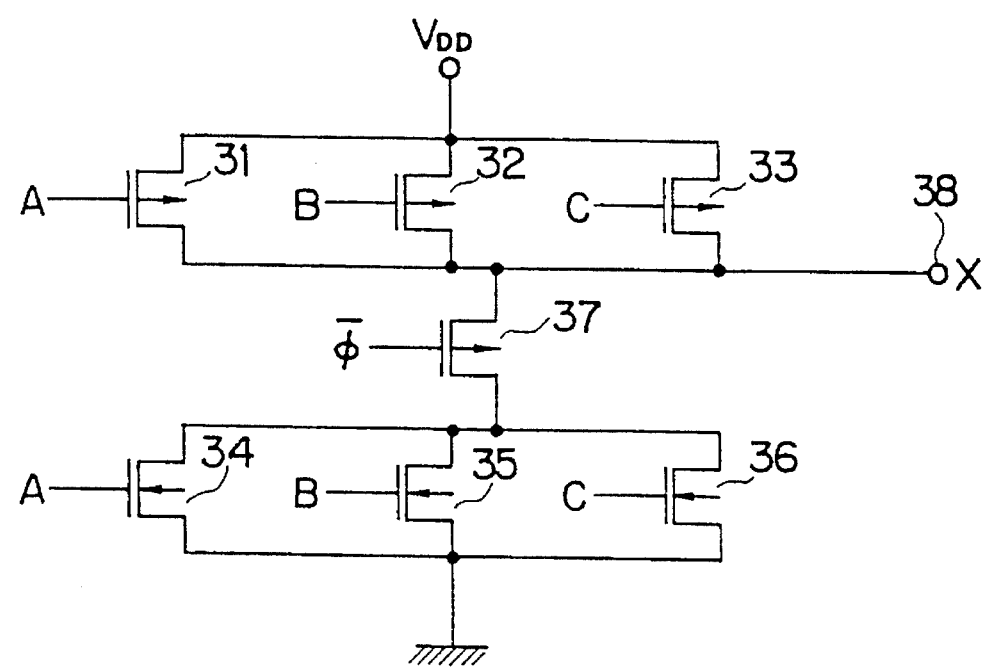
F I G. 7

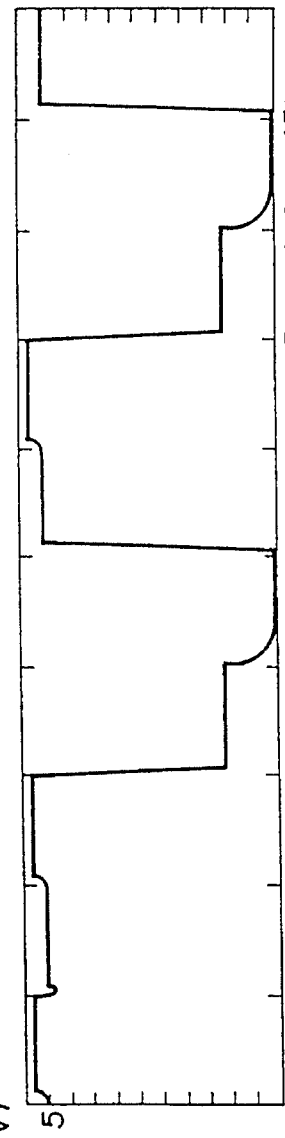
FIG. 10(a) OUTPUT SIGNAL X
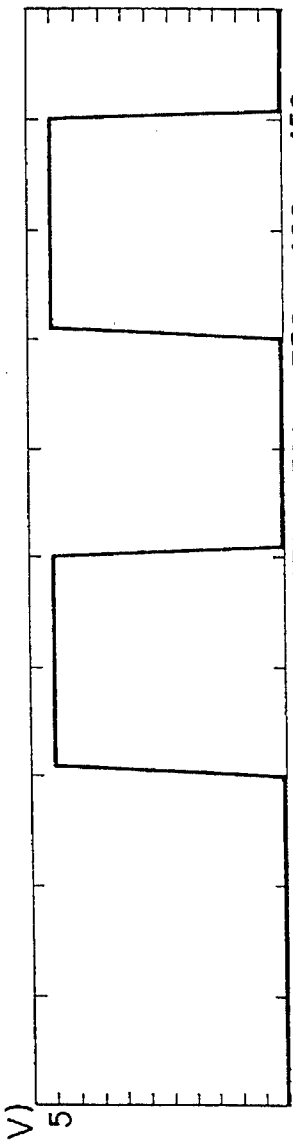
FIG. 10(b) INPUT SIGNAL C
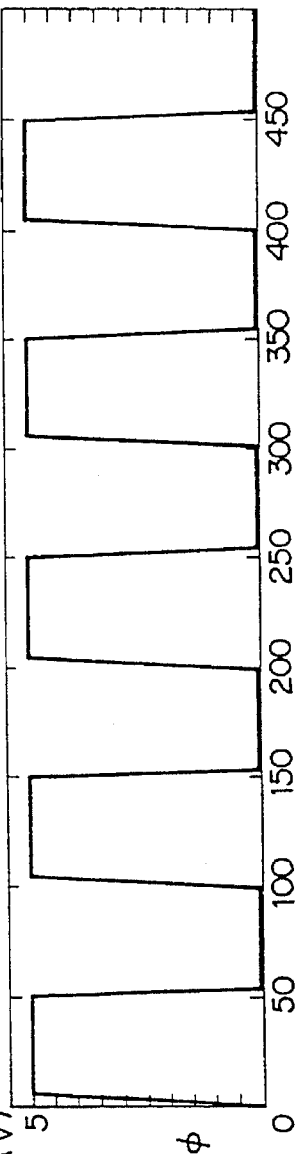
FIG. 10(c) CLOCK SIGNAL /φ

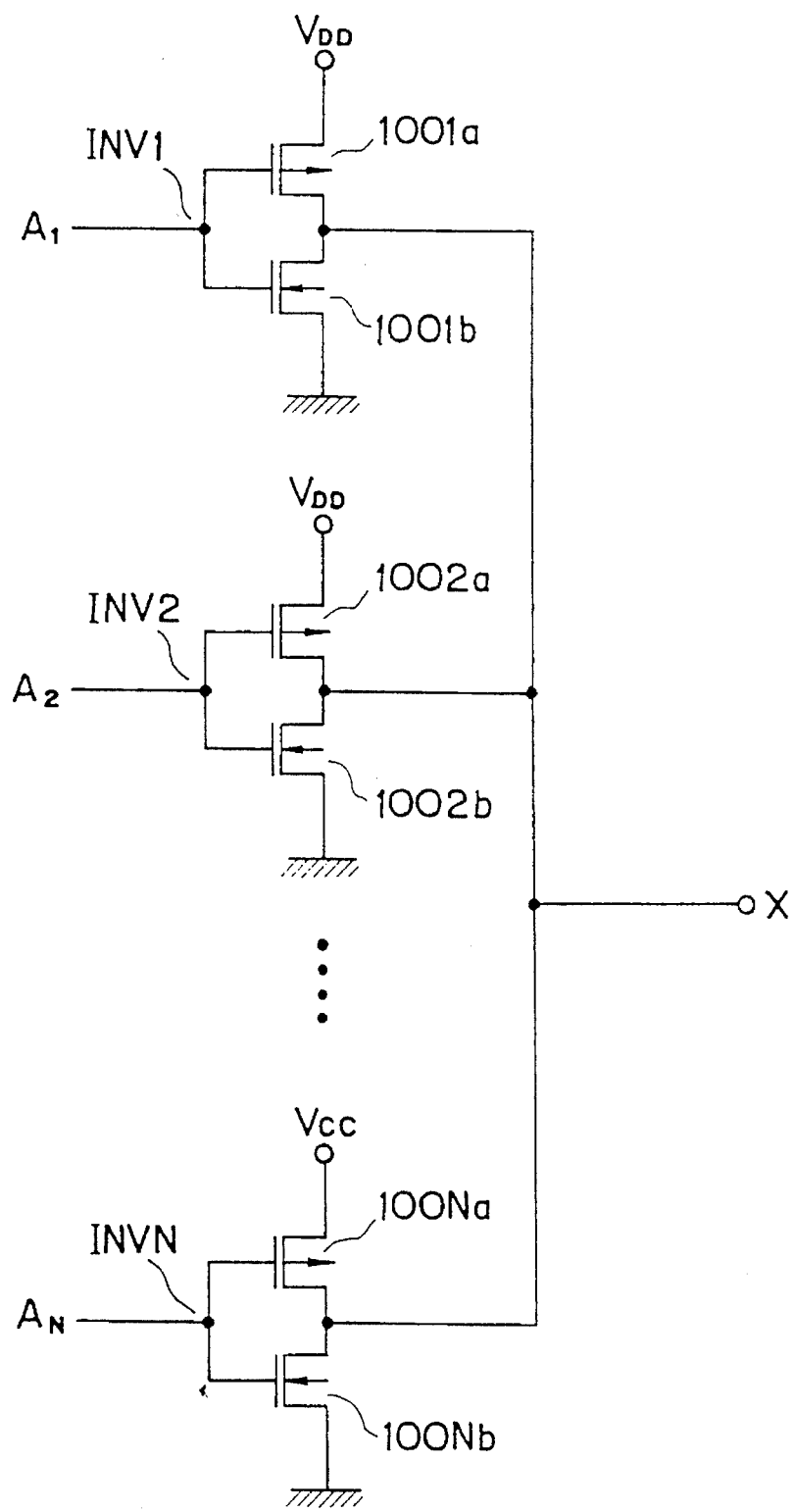
F I G. 14

5,537,063

CMOS LOGIC CIRCUIT WITH PLURAL INPUTS

BACKGROUND OF THE INVENTION

This invention relates to a CMOS logic circuit.

As an example of a CMOS logic circuit related to this invention, a circuit of three input CMOS NOR gate is shown in FIG. 1.

Between a power supply voltage VDD terminal and an output terminal 107, P-channel type MOS transistors 101–103 are connected in series. Further, between output terminal 107 and ground voltage Vss terminal, N-channel type MOS transistors 104–106 are connected in parallel. This NOR gate is advantageous in that static direct current (dc) is not consumed, resulting in small power consumption.

The configuration of another three input NAND gate related to this invention is shown in FIG. 2. In this gate, in a manner oppositely to the NOR gate shown in FIG. 1, P-channel type MOS transistors 111–113 are connected in parallel and N-channel type MOS transistors 114–116 are connected in series.

When a comparison between a NOR gate shown in FIG. 1 and a NAND gate shown in FIG. 2 is made, the NOR gate has a lower operation speed in the case where transistors of the same dimensions are used. This is because P-channel type MOS transistors 101–103 are connected in series in the NOR gate, so it takes much time for charging the output terminal 107 by these transistors 101–103. On the other hand, in the case of a NAND gate, since N-channel type MOS transistors 114–116 are connected in series, but the carrier mobility of an N-channel type MOS transistor is greater than that of a P-channel type MOS transistor, the speed for charging the output terminal 117 is high.

In order to cope with the problem that charging speed in a NOR gate is low, the technology in which static dc is used to realize high charging speed is disclosed in the following literature.

"A Symmetric CMOS NOR gate for high speed application" (IEEE Journal of Solid State Circuits, Volume 23, No. 5 October 1988, pages 1233–1236).

In this literature, the symmetric CMOS NOR gate as shown in FIG. 3 is disclosed. A symmetric CMOS gate refers to a gate in which even if replacement is made in connection with a P-channel type MOS transistor and N-channel type MOS transistor, the configuration of the circuit is not changed.

In this gate, there is no series connection of P-channel type MOS transistors, and P-channel type MOS transistors 121–123 are connected in parallel between power supply voltage VDD terminal and output terminal 127. This configuration corresponds to the configuration in which output terminals of three CMOS inverters are short-circuited.

When data of logic "0" level is inputted to the gates of all P-channel type MOS transistors 121–123 and N-channel type MOS transistors 124–126, three P-channel type MOS transistors 121–123 are turned ON. Namely, output terminal 127 is charged by three P-channel type MOS transistors 121–123 connected in parallel. Thus, this NOR gate operates at a speed higher than that of the NOR gate shown in FIG. 1.

However, the NOR gate shown in FIG. 3 has the problem that power consumption is large. When N-channel type and P-channel type MOS transistors are turned ON at the same time, current flows directly from the power supply voltage VDD terminal to the ground voltage Vss terminal. Although this NOR gate has three input terminals, if a larger number of inputs is provided, power consumption is further increased accordingly. Namely, the problem that power consumption becomes larger with increase in the circuit scale becomes more serious.

SUMMARY OF THE INVENTION

Accordingly, an object of this invention is to provide a CMOS logic circuit adapted so that the operation speed is improved and the power consumption is reduced, or that it is possible to make a design in a manner to have preference to either of them so that the degree of freedom in design is high.

A CMOS logic circuit of this invention comprises a first circuit assembly including a plurality of N number of P-channel type MOS transistors, a second circuit assembly including N number of N-channel type MOS transistors, and a switching element operative so that ON/OFF state is switched by a clock signal inputted from the external, the first circuit assembly, the second circuit assembly and the switching element being connected in series between a first power supply terminal and a second power supply terminal.

For a time period during which the switching element is turned ON by clock signal inputted thereto, the first circuit assembly and the second circuit assembly are connected in series between the first and second power supply terminals so that this circuit operates as a logic circuit. In contrast, for a time period during which the switching element is turned OFF, no power is delivered to the first and second circuit assemblies. Thus, power consumption is reduced.

BRIEF DESCRIPTION OF THE DRAWINGS

In the accompanying drawings:

FIG. 6 is a circuit diagram showing the configuration of a CMOS logic circuit according to a second embodiment of this invention.

FIG. 7 is a circuit diagram showing the configuration of a CMOS logic circuit according to a third embodiment of this invention.

FIG. 10(a)–(c) are time charts showing waveforms of input signal and output signal of the CMOS logic circuit of the first embodiment.

FIG. 14 is a circuit diagram showing the configuration of a CMOS logic circuit related to this invention.

DESCRIPTION OF THE PREFERRED EMBODIMENTS

Preferred embodiments of this invention will now be described with reference to the attached drawings.

Prior to the description of the embodiments, the feature of this invention will be first described. Namely, a CMOS logic circuit of this invention has been constituted by drawing attention to the following point.

A symmetric CMOS logic circuit has the merit that operation speed is high as explained with reference to FIG. 3. However, there are instances where P-channel and N-channel type MOS transistors may be turned ON at the same time, so static current is consumed.

Meanwhile, in a digital system of the synchronous type, a clock signal is used for control of data transfer, and the time period during which the logic circuit output is valid (effective) is determined so that it is fixed. Accordingly, it is not necessary that the logic circuit output is necessarily valid over the entire clock time period. In view of this, in this invention, a switching element operative on the basis of the timing of clock signal for controlling data transfer is provided, thus to allow symmetric CMOS logic circuit to be operative only during a time period when this switching element is turned ON.

In the case where setting is made such that dimensions of a transistor used as a switching element are large, current consumed in the CMOS logic circuit is increased, but operation speed is improved. In contrast, in the case where dimensions of this transistor are reduced, power consumption can be reduced. As stated above, an approach is employed to vary the dimensions of the transistor used as a switching element, thereby making it possible to make a design in a manner to give preference to either operation speed or power consumption. Thus, the degree of freedom of design can be improved.

Figure 4:
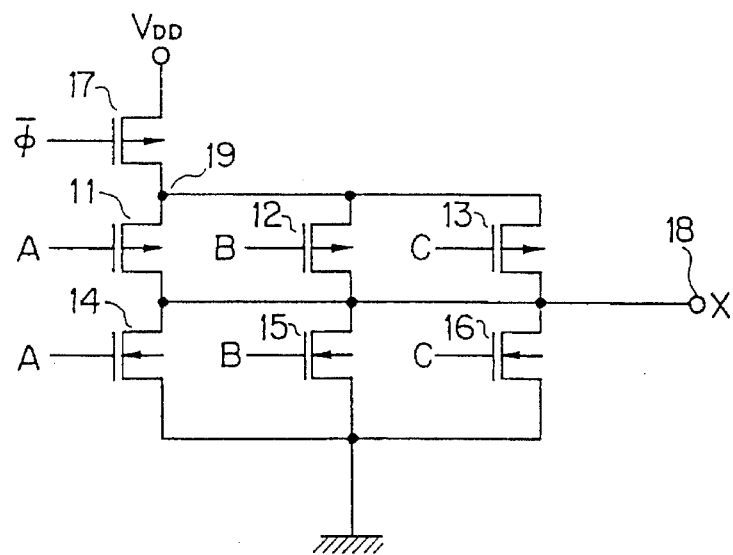
FIG. 4 is a circuit diagram showing the configuration of a CMOS logic circuit according to a first embodiment of this invention.

The configuration of a three input type NOR gate according to the first embodiment of this invention is shown in FIG. 4.

Between a power supply voltage VDD terminal and a connection node 19, a P-channel type MOS transistor 17 as a switching element supplied with clock signal /Φ is connected. Between a connection node 19 and an output terminal 18, P-channel type MOS transistors 11~13 are connected in parallel. Further, between an output terminal 18 and a ground voltage Vss terminal, N-channel type MOS transistors 14~16 are connected in parallel.

Namely, this three input type NOR gate is of a structure in which output terminals of three inverters are all connected, and input signals A, B and C are respectively inputted to input terminals of the three inverters.

Clock signal /Φ is set to logic "0" level only in the time period during which input signals A~C are valid. For a time period when this clock signal /Φ is at logic "0" level, P-channel type MOS transistor 17 is turned ON. As a result, connection node 19 and power supply voltage VDD terminal are caused to be conductive. Thus, this circuit becomes operative. In addition, dimensions of transistors 11~16 are set so that this circuit operates as a NOR gate.

Figure 5:
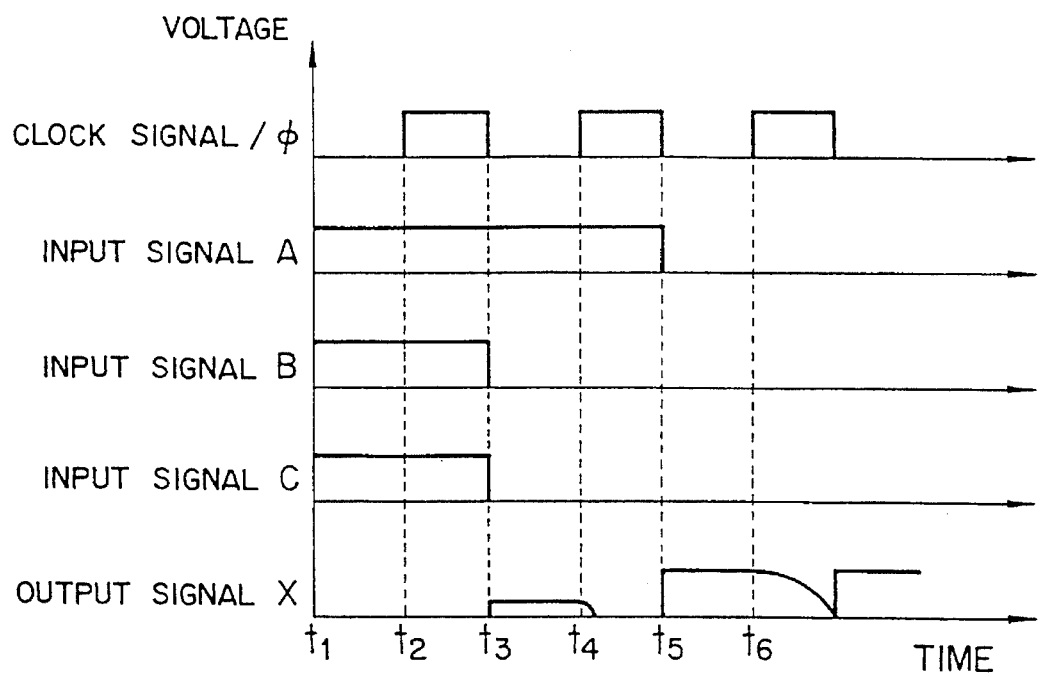
FIG. 5 is a time chart showing waveforms of respective signals in the CMOS logic circuit of the first embodiment.

Time chart of clock signal /Φ, input signals A~C, and output signal X of this CMOS NOR gate is shown in FIG. 5. At the time period between times t1 and t2, clock signal /Φ is at logic "0" level. Thus, this gate is in operative state. Input signals A~C are all at logic "1" level. As a result, P-channel type MOS transistors 11~13 are turned OFF and N-channel type MOS transistors 14~16 are turned ON. From output terminal 18, output signal X of logic "0" level is outputted.

At the time period between times t2 and t3, clock signal /Φ is at logic "1" level, and transistor 17 is turned OFF. As a result, any static current does not flow between power supply voltage VDD terminal and output terminal 18 or ground voltage Vss terminal. Thus, this circuit does not become operative as a NOR gate during this time period. As a result, no current is consumed.

At the time period between times t3 and t4, clock signal /Φ is caused to be at logic "0" level. As a result, this NOR gate operates for a second time. At this time, only input signal A is at logic "1" level, and other input signals B and C are at logic "0" level. As a result, transistors 12, 13 and 14 are turned ON and other transistors 11, 15 and 16 are turned OFF. In this embodiment, dimensions of N-channel type MOS transistors 14~16 are set to a value such that even in the case where only any one of transistors thereof is turned ON and any two of P-channel type MOS transistors 11~13 are turned ON, they discharge output terminal 18 so that the potential of output signal X can be allowed to have logic "0" level.

At the time period from times t4 to t5, clock signal /Φ is at logic "1" level. As a result, P-channel type MOS transistor 17 is turned OFF. This circuit does not operate as a NOR gate.

At the time period from times t5 to t6, clock signal /Φ is at logic "0" level. As a result, P-channel MOS transistor 18 is turned ON. Thus, this circuit is placed in an operative state. Input signals A~C are all at logic "0" level. As a result, P-channel type MOS transistors 11~13 are turned ON and N-channel type MOS transistors 14~16 are all turned OFF. Thus, output signal X of logic "1" level is outputted from output terminal 18.

The CMOS logic circuit of this embodiment operates as a NOR gate only at the time period during which clock signal /Φ is at logic "0" level. In contrast, at the period during which clock signal /Φ is at logic "1" level, no current is consumed. Thus, power consumption can be reduced.

Further, dimensions of P-channel type MOS transistor 17 are varied, thereby making it possible to adjust operation speed and power consumption. In the case where dimensions of transistor 17 are set to larger values, operation speed is advantageously improved to a greater degree. In contrast, in the case where such dimensions are set to small values, power consumption is advantageously reduced.

The configuration of a three input NAND gate according to the second embodiment is shown in FIG. 6. The gate of this embodiment is of a structure in which output terminals of three inverters are connected similarly to the three input NOR gate according to the first embodiment. It should now be noted that P-channel type MOS transistor 27 of which gate is supplied with clock signal Φ is connected between connection node to which sources of N-channel type MOS transistors 24~26 are connected and ground voltage Vss terminal.

In operation, when clock signal Φ of logic "1" level is inputted, P-channel type MOS transistor 27 is turned ON. At this time, dimensions of respective transistors 21~26 are set so that this circuit operates as a NAND gate. Namely, dimensions of transistors 21~26 are set so that in the case where two of the N-channel type MOS transistors 24~26 are turned ON, output terminal 28 is charged by any one of the transistors which are in ON state of P-channel type MOS transistors 21~23 to output signal X of logic "1" level. Here, it is necessary to make consideration such that even in the case where any error in the manufacturing process exists, the level of output signal X can be allowed to have logic "1" level.

Also in the NAND gate of this embodiment, similarly to the NOR gate according to the first embodiment, power consumption of the entirety of the circuit can be advantageously reduced. In the case where dimensions of P-channel type MOS transistor 27 corresponding to the switching element are set to large values, the operation speed is caused to be higher. In contrast, in the case where such dimensions are set to small values, power consumption can be reduced considerably.

The configuration of a CMOS logic circuit according to the third embodiment is shown in FIG. 7. This circuit operates as a three input NOR gate. P-channel type MOS transistor 37 of which gate is supplied with clock signal /Φ is connected between drains of P-channel type MOS transistors 31~33 connected in parallel and drains of N-channel type MOS transistors 34~36 connected in parallel. Only in the case where clock signal /Φ is at logic "0", this circuit operates as a NOR gate.

As compared to the NOR gate according to the first embodiment shown in FIG. 4, the NOR gate according to this embodiment has higher operation speed in the case where the process technology is the same and dimensions of transistor are the same. This is based on the reason described below. Namely, in the first embodiment, the number of terminals of transistors 11~16 connected to output terminal 18 is 6. On the contrary, in the third embodiment, only terminals of four transistors 31~33 and 37 are connected to output terminal 38. As a result, capacitance parasitic to output terminal is decreased. Thus, time required for charge/discharge operation can be shortened.

Figure 8:
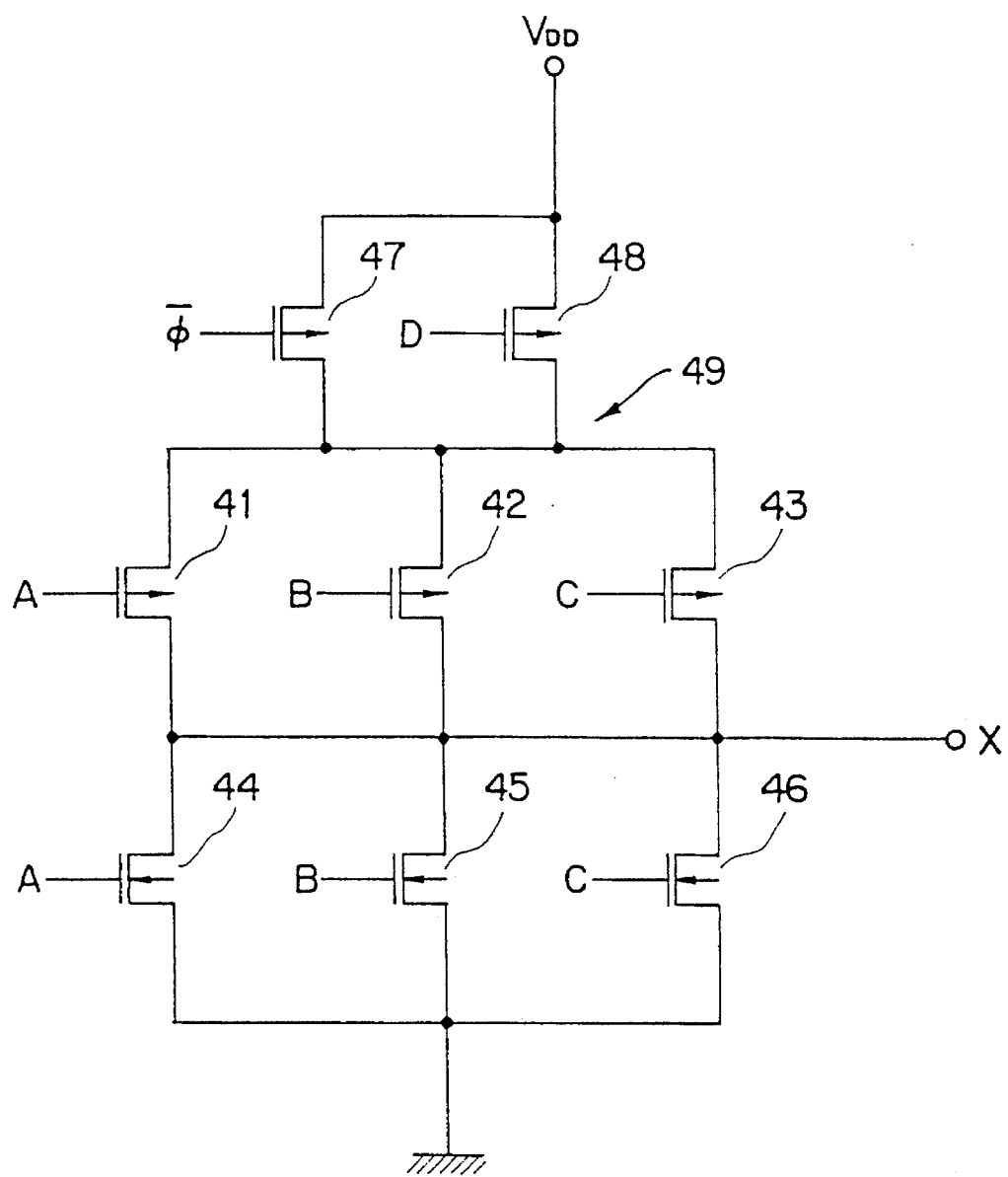
FIG. 8 is a circuit diagram showing the configuration of a CMOS logic circuit according to a fourth embodiment of this invention.

A three input type NOR gate according to the fourth embodiment of this invention has a configuration as shown in FIG. 8. This NOR gate differs from NOR gate according to the first embodiment shown in FIG. 4 in that two P-channel type MOS transistors 47 and 48 are connected in parallel between power supply VDD terminal and connection nodes 49 to which drains of P-channel type MOS transistors 41~43 are connected.

In this embodiment, in the case where the transistor 48 is turned ON or OFF by input signal D inputted to gate of transistor 48, operation speed or power consumption can be improved, and in the case where the transistor 48 is turned ON, operation speed or power consumption can be improved by changing dimensions of transistor 48.

In the case where transistor 48 is turned ON, since transistors 47 and 48 connect in parallel between power supply voltage VDD terminal and connection node 49, operation speed can be improved more. Further, even in such a case, operation speed is further improved when dimensions of transistor 48 are large. In the case where transistor 48 is caused to be turned OFF, this circuits operates similarly to that of the first embodiment.

As described above, in accordance with the first to fourth embodiments of this invention, it is possible to reduce consumption of static current while maintaining high speed characteristic of the symmetric CMOS logic circuit.

Further, dimensions of transistors 17, 27, 37, 47, 48 provided as switching element are adjusted, thereby making it possible to easily make a design in a manner to have preference to either improvement in operation speed and reduction of power consumption.

In addition, in accordance with the third embodiment of this invention, capacitance parasitic to output terminal, thus making it possible to further improve operation speed.

Dimensional ratio between P-channel type MOS transistor and N-channel type MOS transistor, which is required to be set at the time of designing CMOS logic circuit, will now be described.

Figure 1:
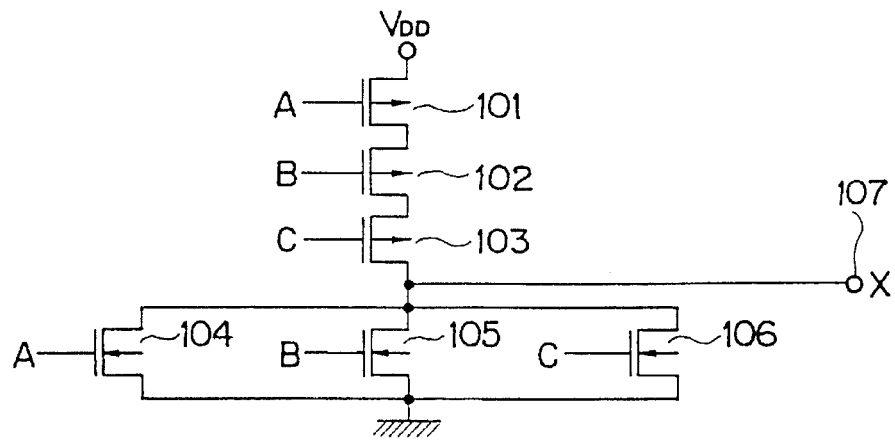
FIG. 1 is a circuit diagram showing the configuration of a conventional CMOS logic circuit.
Figure 2:
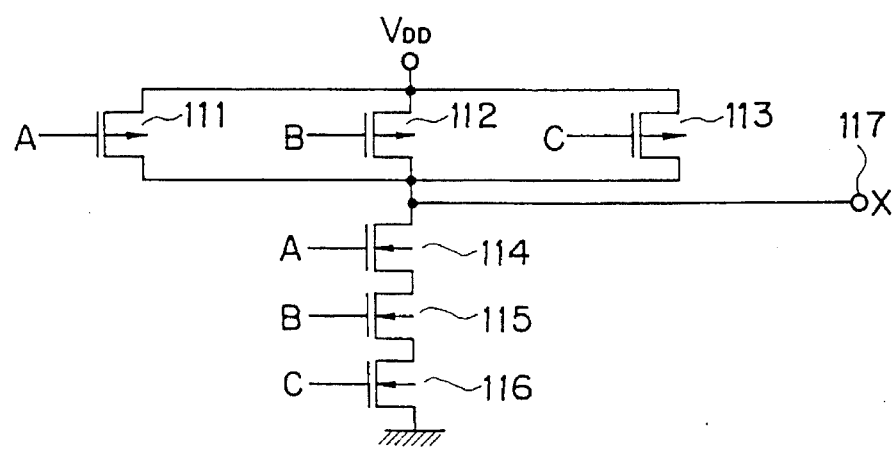
FIG. 2 is a circuit diagram showing the configuration of another conventional CMOS logic circuit.
Figure 3:
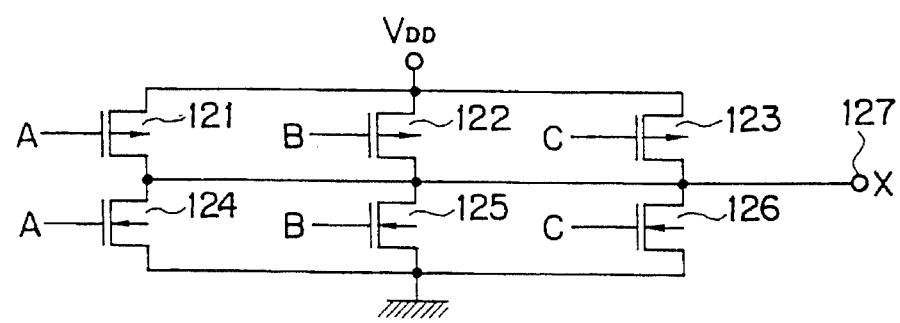
FIG. 3 is a circuit diagram showing the configuration of a further conventional CMOS logic circuit.

In the symmetric type CMOS logic circuit shown in FIG. 3, dimensional ratio between P-channel type MOS transistors 121~123 and N-channel type MOS transistors 124~126 was set by using the following formula (1):

$$(Wp/Lp)/(Wn/Lp) \leq M \qquad (1)$$

where

Wp is channel width of P-channel type MOS transistor,

Lp is channel length of P-channel type MOS transistor,

Wn is channel width of N-channel type MOS transistor,

Ln is channel length of N-channel type MOS transistor, and

M is constant determined in the manufacturing process.

On the other hand, in the symmetric CMOS logic circuit according to the first to third embodiments, dimensional ratio between N-channel type MOS transistor and P-channel type MOS transistor is determined by using the following formula (2):

$$[(X(N-1)/(X+N-1)] \cdot (Wp/Lp)/Wn/Ln)] \leq M \qquad (2)$$

where X=Wc/Wp, Lc=Lp, Ln=Lp

Wc is channel width of P-channel type MOS transistor used as switching element,

Lc is channel length of P-channel type MOS transistor used as switching element, and N is the number of signals inputted to the gate.

In the case where N-channel type MOS transistor is used as switch element, the following formula (3) is used.

$$[(X+N-1)/X(N-1)] \cdot [(Wp/Lp)/(Wn/Ln)] \leq M \qquad (3)$$

where X=Wc/Wn, Lc=Ln and Lp=Ln.

When the above-described formula (2) or (3) used in this invention is compared to the formula (1) used in the device shown in FIG. 3, the degree of freedom of design can be improved by varying value of X.

For example, a manufacturing process which cannot be used in CMOS logic circuit as shown in FIG. 3 can also be used resulting from improvement in degree of freedom.

While, in all of the above-described circuits, three CMOS inverters are used so that their output terminals are connected to each other, design in the case where N number of inverters are used will be described below.

In the circuit shown in FIG. 14, inverter INV1 comprised of P-channel type MOS transistor 1001a and N-channel type MOS transistor 1001b, inverter INV2 comprised of P-channel type MOS transistor 1002a and N-channel type MOS transistor 1002b, . . . , INVN comprised of P-channel type MOS transistor 100Na and N-channel type MOS transistor 100Nb are arranged, and all output terminals are commonly connected.

Gates of inverters INV1~INVN are respectively supplied with input signals A1~AN. It is now assumed that only input signal A1 is at logic "1" level and other input signals A2~An are all at logic "0" level. Only one N-channel type MOS transistor 1001b of N-channel type MOS transistors 1001b~100Nb is turned ON, and (N−1) number of P-channel type MOS transistors 1002a~100Na are turned ON. Discharge must be conducted so that potential VOL of output signal X is caused to be at logic "0" level by one N-channel type MOS transistor 1001b. Here, it is necessary that potential VOL is lower than voltage threshold Vth of N-channel type MOS transistors 1001b~100Nb.

Assuming that currents of P-channel type MOS transistors 1002a~100Na are IDp2~IDPN and current of N-channel type MOS transistor 1001b is IDn1, the following relationship must hold:

$$IDp2+IDp3+\ldots+IDpN=IDn1 \tag{4}$$

From this formula (4), the following formula (5) is derived in relation to the dimensions of transistor.

$$Kp(W/L)p(N-1)(VSGp-|Vtp|)^2=Kn(W/L)n\times[2(VGSn-Vth)VDSn-VDSn^2] \tag{5}$$

Here, in the case where capacitance per unit area of capacitor portion between gate and channel is COX, mobility of positive hole is μp, and mobility of electron is μn, the following formulas (6) and (7) hold.

$$Kp=\mu p \cdot COX/2 \tag{6}$$

$$Kn=\mu n \cdot COX/2 \tag{7}$$

When these relationships are used, the above-mentioned formula (5) is expressed as follows.

$$(N-1)(W/L)n/(W/L)n=Kn[2(VGSn-Vtn)\times VDSn-VDSn^2]/Kp(VSGp-|Vtp|)^2 \tag{8}$$

The right side of the above formula (8) is constant and determined by the manufacturing process.

In order allow the relationships of VOL≦|Vtp| and VOL≦|Vtn| to both hold, when it is assumed that VOL≦VDSn and LP=Ln, the following formula (9) holds:

$$(N-1)Wp \leq Wn \cdot M \tag{9}$$

M in the formula (9) is defined as follows.

$$M=Kn[2(VGSn-Vth)VDSn-VDSn^2]/Kp(VSGp-|Vtp|))^2$$

For example, assuming that constant M is 1 and the number N of inverters is 4, the following relationshsip holds.

$$3Wp \leq Wn \tag{10}$$

Thus, it is seen that respective dimensions of P-channel type MOS transistors 1001a~100Na are required to be at least three times greater than those of N-channel type MOS transistors 1001b~100Nb.

Figure 15:
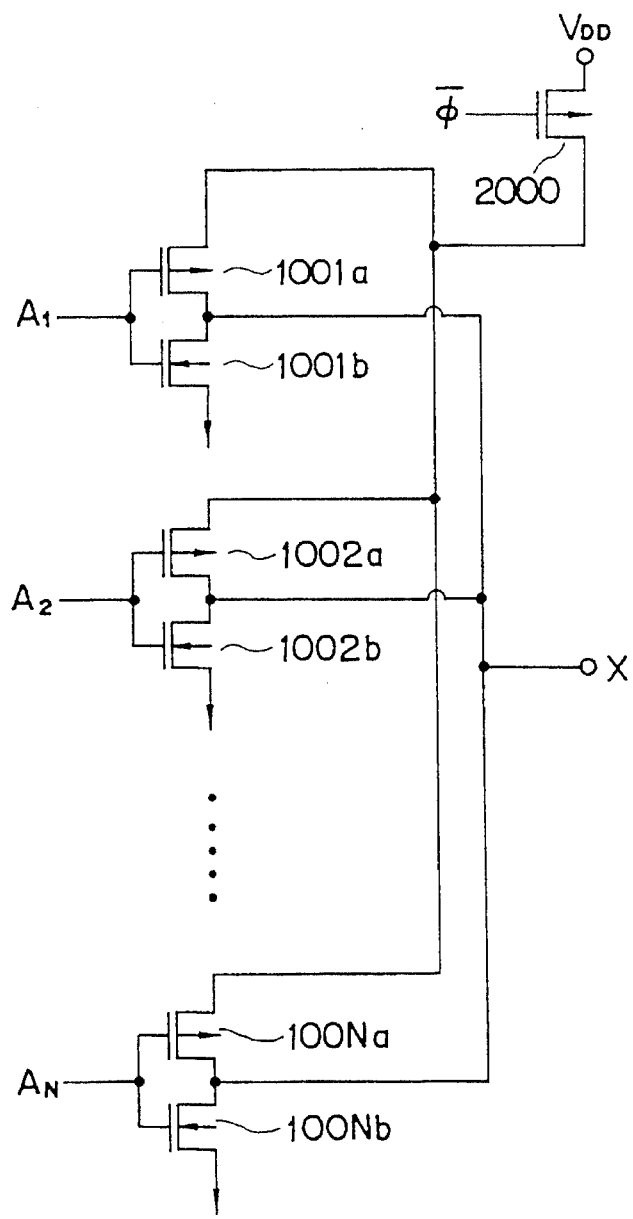
FIGS. 15(a) and (b) are circuit diagrams showing the configuration of a CMOS logic circuit according to a fifth embodiment of this invention.
Figure 15:
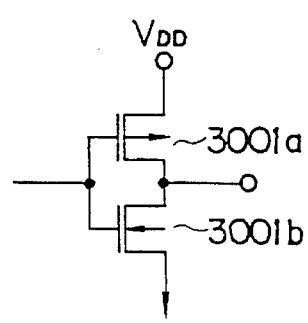

The configuration of a circuit according to the fifth embodiment in which this invention is applied to N number of inverters INV1~INVN is shown in FIG. 15(a).

Between a power supply voltage VDD terminal and commonly connected sources of P-channel type MOS transistors 1001a~100Na, P-channel type MOS transistor 2000 is connected.

It is now assumed that the circuit shown in FIG. 15(a) has the same characteristic of output X as that of inverter comprised of P-channel type MOS transistor 3001a and N-channel type MOS transistor 3001b shown in FIG. 15(b).

In this case, assuming that channel width and channel length of P-channel type MOS transistor 3001a are respectively Wp' and Lp', and channel width and channel length of N-channel type MOS transistor 3001b are respectively Wn' and Ln', the following relationships hold.

$$Wn'=N \cdot Wn \tag{11}$$

$$Ln'=L \tag{12}$$

From the circuit of FIG. 12(b), the following relationship holds.

$$\begin{aligned}(Wp'/Lp') &= \{L/Wc+L/[(N-1)\cdot Wp]\}^{-1} \\ &= WpWc(N-1)/\{L\cdot Wp\cdot N-1+Wc\}\\ &= X(N-1)Wp/[(N+X-1)\cdot L]\end{aligned} \tag{13}$$

Further, the following relationship holds.

$$X(N-1)\cdot Wp/(N+X-1) \leq Wn \cdot M \tag{14}$$

Assuming now that constant M of manufacturing process is 1 and the number N of inverters is 4, $$3X \cdot Wp/(3+X) \leq Wn \tag{15}$$

As seen from the above-mentioned formula (13), even in the case where widths Wp of P-channel type MOS transistors 1001a~100Na, value of X which is dimension of P-channel type MOS transistor 2000 is changed, thereby making it possible to change dimensions of N-channel type MOS transistors 1001b~100Nb. Thus, degree of freedom in design can be high.

Assuming now that power supply voltage VDD is 3.3 V, threshold voltages Vth and |Vtp| are both 0.8 V and Kn is substantially 1.5 Kp, constant M becomes equal to substantially 0.7. When the number N of inverters is assumed to be 10, it is necessary that the following relationship must hold.

$$Wn \geq 12.5 Wp \tag{16}$$

As stated above, the channel width of N-channel type MOS transistor must be large. These transistors are required by the number N of inverters, leading to an increase in chip area.

On the contrary, in the fifth embodiment, when X is assumed to be 1, the following relationship holds.

$$Wn \geq 1.4 Wp \tag{17}$$

From this relationship, it is seen that the dimensions of N-channel type MOS transistor can be reduced, resulting in reduced chip area.

The simulated result carried out for comparison between current consumption in CMOS logic circuit according to the first embodiment shown in FIG. 4 and current consumption in the CMOS logic circuit shown in FIG. 3 will now be described.

The dimensional relationship of respective transistors in the first embodiment is assumed as follows: width W and length L of P-channel type MOS transistors 11~13 are respectively 8 μm and 2 μm; width W and length L of P-channel type MOS transistor 17 are respectively 11 μm and 2 μm, and width W and length L of N-channel type MOS transistors 14~16 are respectively 4 μm and 2 μm.

It is further assumed that P-channel type MOS transistors 121~123 and N-channel type MOS transistors 124~126 shown in FIG. 3 have both width of 4 μm and length L of 2 μm.

Figure 9A:
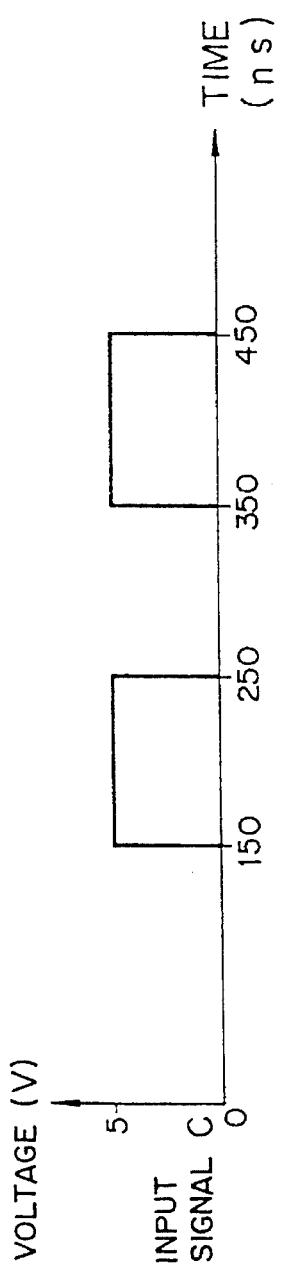
FIGS. 9(a)–(d) are a time chart showing waveforms of respective signals inputted to the CMOS logic circuit according to the first embodiment of this invention.
Figure 9B:
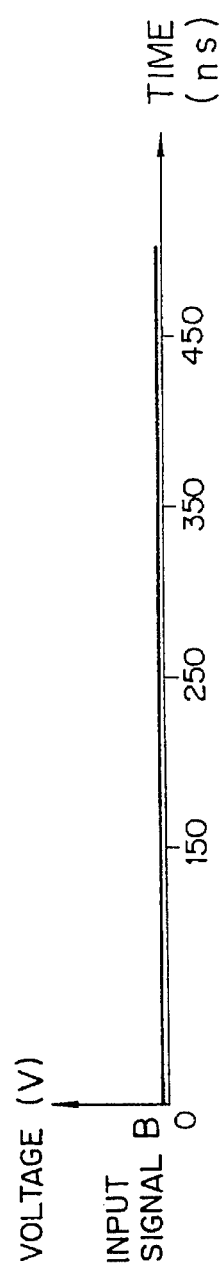
Figure 9C:
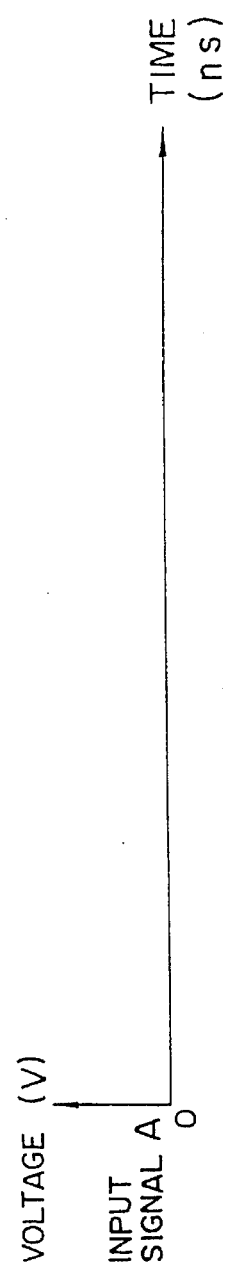
Figure 9D:
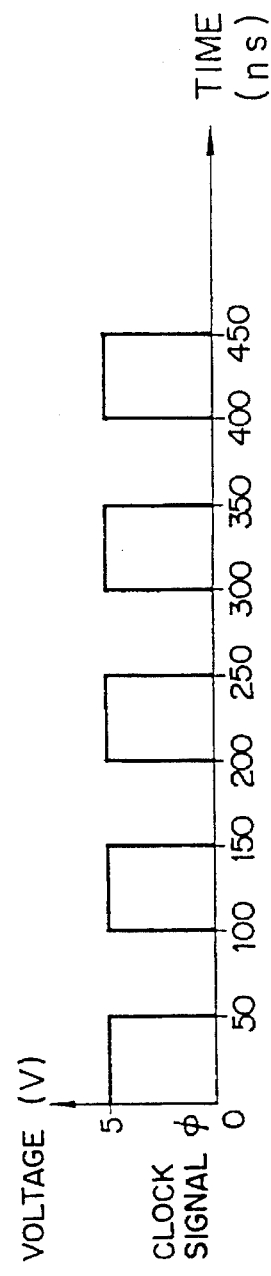

Waveform of clock signal /Φ inputted commonly to the CMOS logic circuit according to the first embodiment shown in FIG. 4 and the CMOS logic circuit shown in FIG. 3 is shown in FIG. 9(d), waveform of input signal A inputted thereto is shown in FIG. 9(c), waveform of input signal B inputted thereto is shown in FIG. 9(b), and waveform of input signal C inputted thereto is shown in FIG. 9(a).

Figures 11A, 11B:
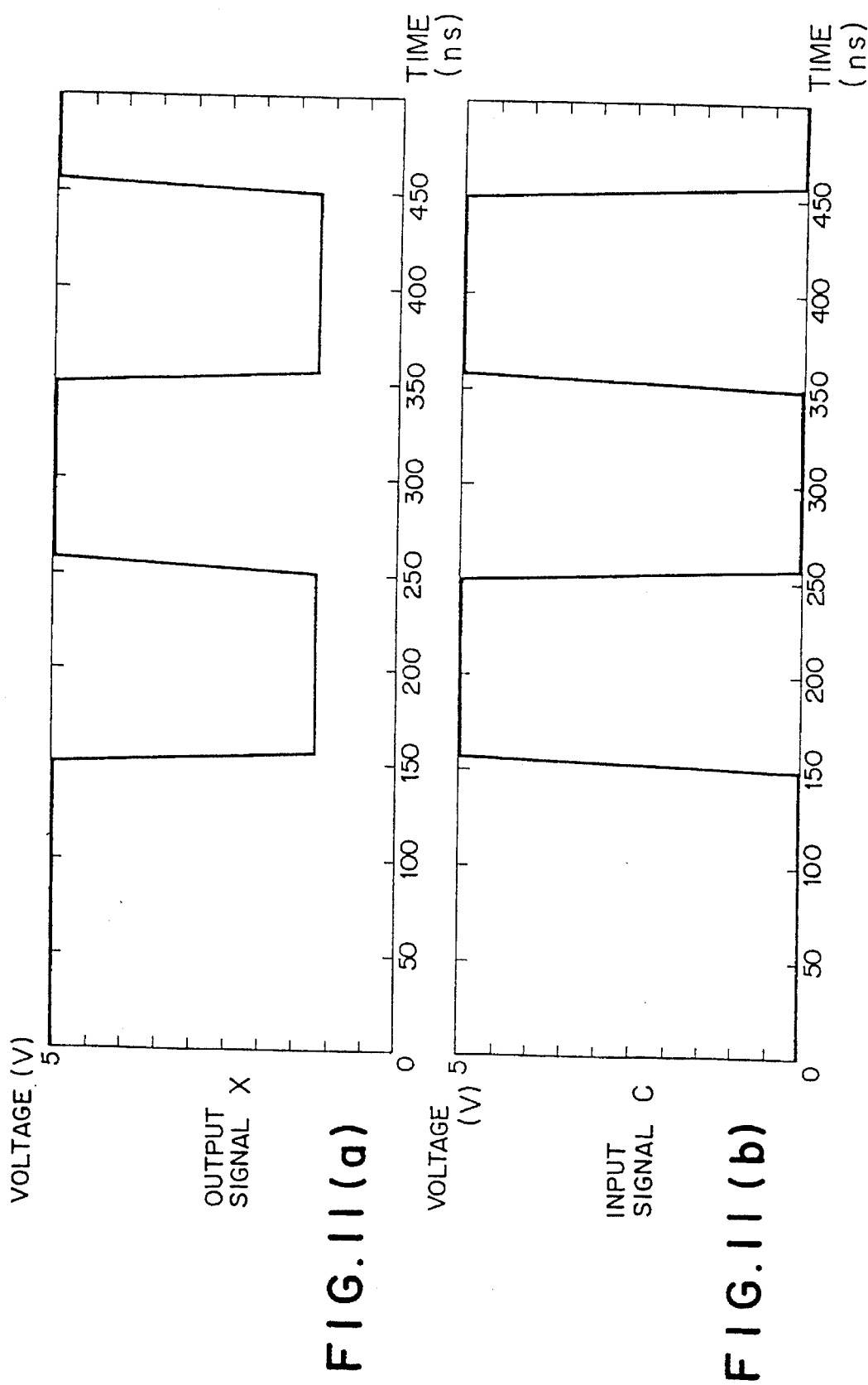
FIGS. 11(a) and (b) are time charts showing input signal and output signal of the CMOS logic circuit shown in FIG. 3.

Waveform of output signal X in the CMOS logic circuit according to the first embodiment is shown in FIG. 10 along with waveforms of input signal C and clock signal /Φ. Further, waveform of output signal X in the CMOS logic circuit shown in FIG. 3 is shown in FIG. 11 along with input signal C.

Figure 12:
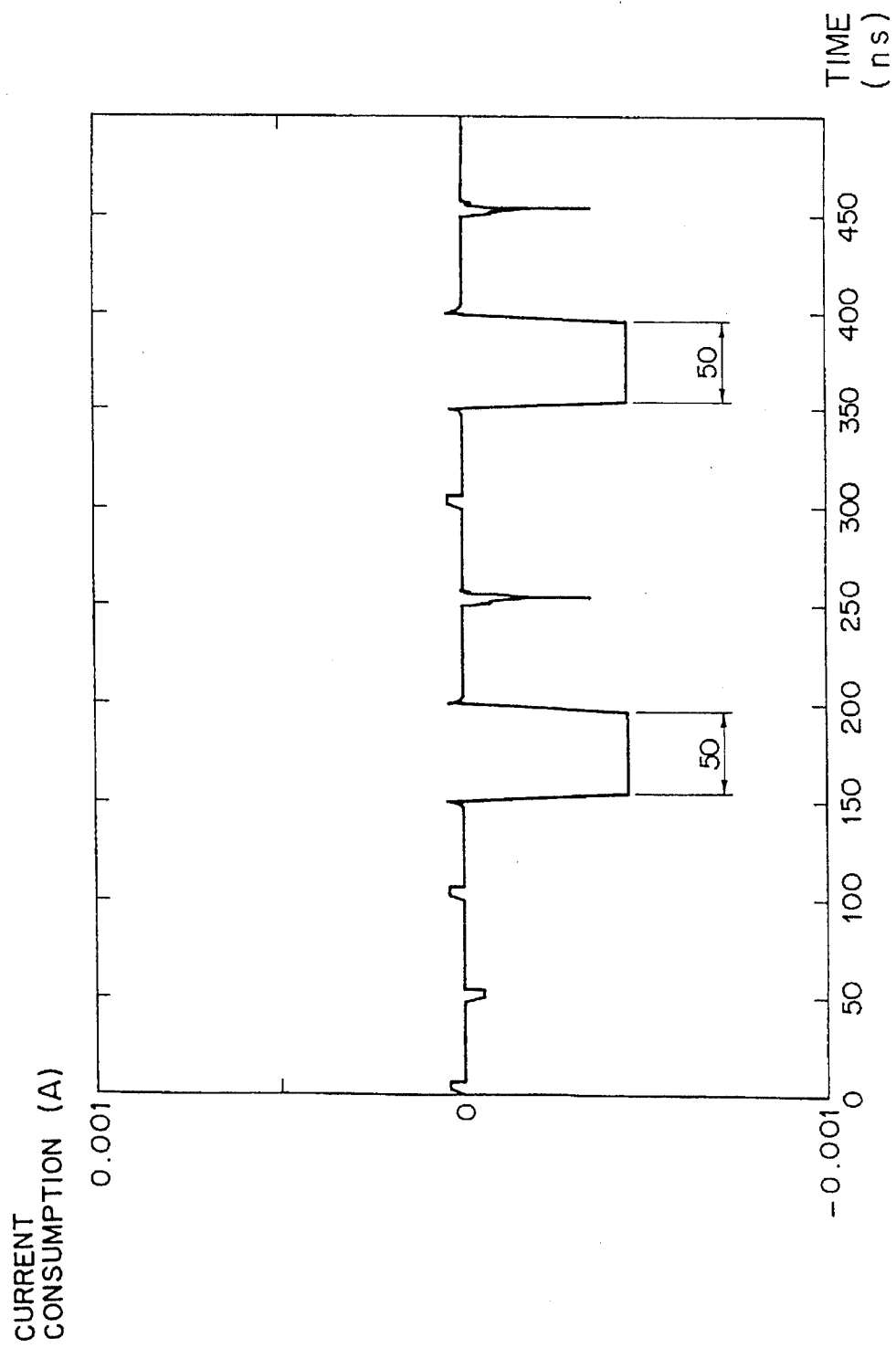
FIG. 12 is an explanatory view showing current consumption of the CMOS logic circuit according to the first embodiment of this invention.
Figure 13:
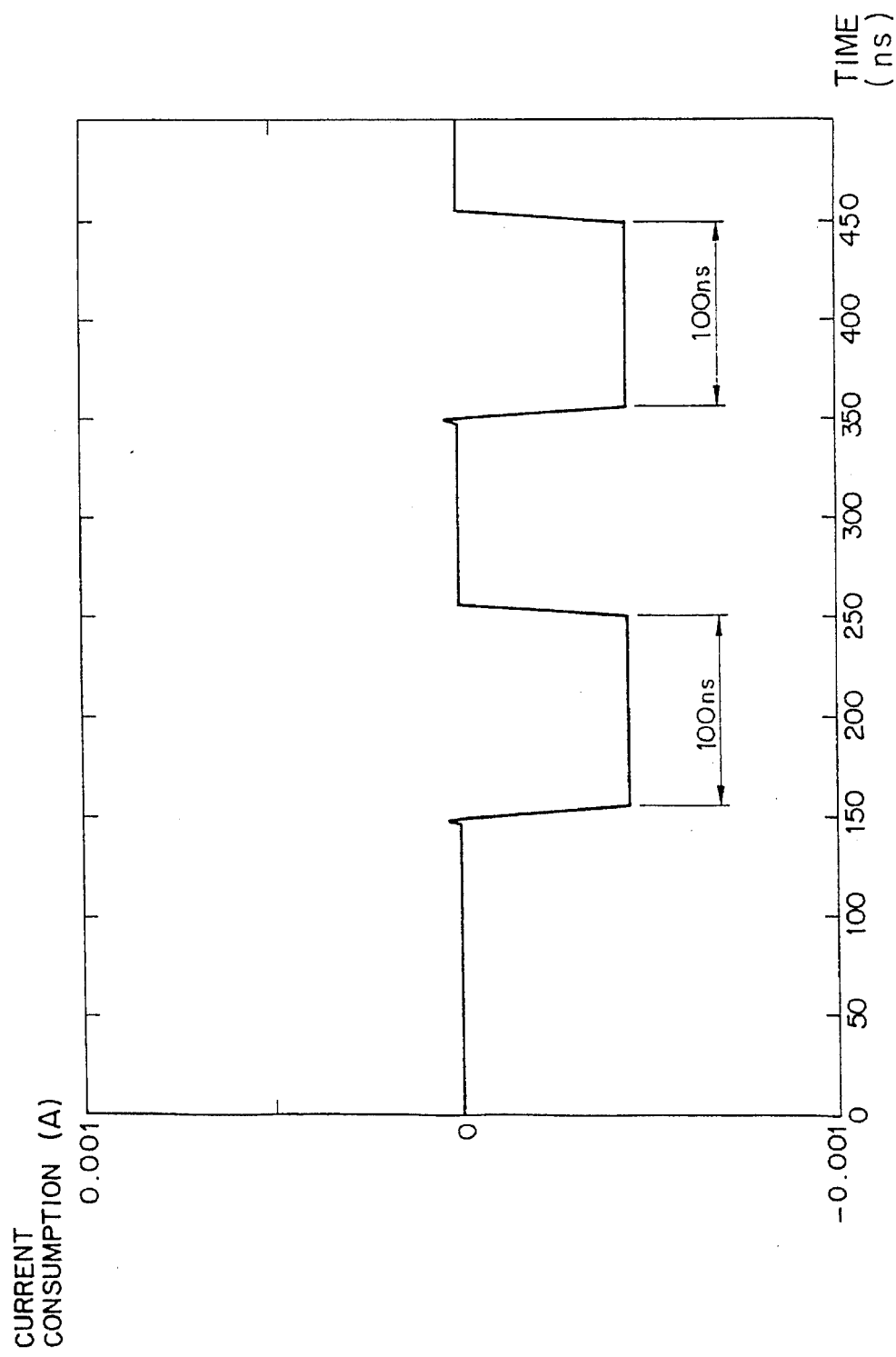
FIG. 13 is an explanatory view showing current consumption of a CMOS logic circuit related to this invention.

Current consumed in the CMOS logic circuit according to the first embodiment is shown in FIG. 12 and current consumption of the CMOS logic circuit shown in FIG. 3 is shown in FIG. 13. As is clear from the comparison between FIGS. 12 and 13, current the consumption of this embodiment is reduced to about one half of that of the circuit shown in FIG. 3. This is because the circuit of this embodiment operates as a NOR gate only when the clock signal /Φ is at a low level.

The above-described embodiments are presented only for illustrative purpose, and they do not limit this invention in any sense. While, e.g., an MOS type transistor is used as a switching element in the embodiment, there may be employed any element capable of controlling conduction between first and second circuit assemblies.

What is claimed is:

1. A CMOS logic circuit comprising:
a first circuit assembly including N, where N is an integer greater than or equal to 2, number of P-channel type MOS transistors connected in parallel;
a second circuit assembly including N number of N-channel type MOS transistors connected in parallel; and
a switching element having an ON/OFF state that is switched by a clock signal inputted externally,
said first circuit assembly, said second circuit assembly and said switching element being connected in series between a first power supply terminal and a second power supply terminal.

2. A CMOS logic circuit as set forth in claim 1, wherein said switching element is an N-channel type MOS transistor or a P-channel type MOS transistor, said switching element being such that said ON/OFF state is switched by said clock signal inputted to a gate of the N-channel type MOS transistor or the P-channel type MOS transistor.

3. A CMOS logic circuit as set forth in claim 1,
wherein said first circuit assembly is such that said P-channel type MOS transistors are connected in parallel, that one ends of said P-channel type MOS transistors are commonly connected, that the other ends thereof are commonly connected, and that N kinds of different signals are respectively inputted to gates of said P-channel type MOS transistors, and
wherein said second circuit assembly is such that said N-channel type MOS transistors are connected in parallel, that one ends of said N-channel type MOS transistors are commonly connected, that the other ends thereof are commonly connected, and that said N kinds of different signals are respectively inputted to gates of said N-channel type MOS transistors.

4. A CMOS logic circuit as set forth in claim 3, wherein said clock signal inputted to said switching element is a signal having a value such that said switching element is turned ON only for the time period during which said N kinds of different signals are valid.

5. A CMOS logic circuit as set forth in claim 3,
wherein commonly connected one ends of said P-channel type MOS transistors that said first circuit assembly has are connected to said first power supply terminal, and commonly connected the other ends of said P-channel type MOS transistors are connected to one end of said switching element and an external output terminal, and
wherein commonly connected one ends of said N-channel type MOS transistors that said second circuit assembly has are connected to the other end of said switching element, and commonly connected the other ends of said N-channel type MOS transistors are connected to said second power supply terminal.

6. A CMOS logic circuit as set forth in claim 3,
wherein said switching element includes a plurality of switching means arrayed in parallel, one end of said switching means being commonly connected and the other ends of said switching means being commonly connected,
wherein at least two kinds of clock signals exist as said clock signal, said at least two kinds of clock signals being inputted to said plurality of switching means, and
wherein at least one of said at least two kinds of clock signals has a value such that said switching means supplied with said at least one of said two kinds of clock signals is turned ON for a time period during which said N kinds of different signals are valid.

7. A CMOS logic circuit as set forth in claim 1, wherein when it is assumed that channel width and channel length of said P-channel type MOS transistor are respectively Wp and Lp, channel width and channel length of said N-channel type MOS transistor are respectively Wn and Ln, and a constant determined by the manufacturing process is M,
in the case where a P-channel type MOS transistor having channel width Wc and channel length Lc is used as said switching element, the following relationship holds:

$$[X(N-1)/(X+N-1)]\cdot[(Wp/Lp)/(Wn/Lp)] \leq M$$

where X=Wc/Wp, and in the case where an N-channel MOS transistor having channel width Wc and channel length Lc is used as said switching element, the following relationship holds:

$$[(X+N-1)/X(N-1)]\cdot[(Wp/Lp)/(Wn/Ln)] \leq M$$

where $X=Wc/Wn$.

8. A CMOS logic circuit as set forth in claim 2, wherein when it is assumed that channel width and channel length of said P-channel type MOS transistor are respectively Wp and Lp, channel width and channel length of said N-channel type MOS transistor are respectively Wn and Ln, and a constant determined by the manufacturing process is M, in the case where a P-channel type MOS transistor having channel width Wc and channel length Lc is used as said switching element, the following relationship holds:

$$[X(N-1)/(X+N-1)]\cdot[(Wp/Lp)/(Wn/Lp)] \leq M$$

where $X=Wc/Wp$, and in the case where an N-channel MOS transistor having channel width Wc and channel length Lc is used as said switching element, the following relationship holds:

$$[(X+N-1)/X(N-1)]\cdot[(Wp/Lp)/(Wn/Ln)] \leq M$$

where $X=Wc/Wn$.

* * * * *